United States Patent
Kamibayashi et al.

[11] Patent Number: 5,878,069
[45] Date of Patent: Mar. 2, 1999

[54] SEMICONDUCTOR LASER DIODE ASSEMBLY

[75] Inventors: Hidefumi Kamibayashi, Kyoto; Naofumi Aoki, Kameoka, both of Japan

[73] Assignee: Rohm Co. Ltd, Kyoto, Japan

[21] Appl. No.: 747,337

[22] Filed: Nov. 12, 1996

[30] Foreign Application Priority Data

Nov. 14, 1995 [JP] Japan ................................ 7-295387
Apr. 12, 1996 [JP] Japan ................................ 8-090909

[51] Int. Cl.⁶ .................................................. H01S 3/042
[52] U.S. Cl. ........................................... 372/36; 372/109
[58] Field of Search ........................ 372/36, 109; 257/99

[56] References Cited

U.S. PATENT DOCUMENTS

| | | | |
|---|---|---|---|
| 5,089,861 | 2/1992 | Tanaka et al. | 372/36 |
| 5,245,620 | 9/1993 | Tanaka et al. | 372/36 |
| 5,578,863 | 11/1996 | De Poorter | 257/81 |

FOREIGN PATENT DOCUMENTS

| | | | |
|---|---|---|---|
| 359149071 | 8/1984 | Japan | 257/99 |

*Primary Examiner*—James W. Davie
*Attorney, Agent, or Firm*—Nikaido Marmelstein Murray & Oram, LLP

[57] ABSTRACT

There is disclosed a semiconductor laser diode assembly. A semiconductor laser diode emits a beam of light. A ring member has a heat sink formed integral therewith. The semiconductor laser diode is mounted on the heat sink through a sub-mount. A common electrode is formed integral with the ring member. The common electrode extends opposite to the heat sink. Lead electrodes are held by the ring member through an insulating material filled therebetween in an airtight manner. A stem unit formed by the ring member, the lead electrodes, and the insulating material to provide electrical connection to the semiconductor laser diode. A cap unit fixed on the stem unit for hermetically sealing the semiconductor laser diode. The cap unit has a window through which a beam of light emitted by the semiconductor laser diode is radiated. The semiconductor laser diode assembly is made compact in size and easy to manufacture, providing a source of laser beam adapted for CD players, CD-ROM players and so on.

7 Claims, 6 Drawing Sheets

SEMICONDUCTOR LASER DIODE ASSEMBLY

BACKGROUND OF THE INVENTION

This invention relates to semiconductor laser diode assemblies of the can-seal type having a laser diode hermetically sealed in a space defined between a metal can and a stem assembled therewith, and more particularly to such assemblies which are reduced in size for use in optical pickup devices such as CD players, LD players, and CD-ROM players.

Semiconductor laser diode assemblies conventionally used for optical pickup devices for CD players etc. are generally constructed as shown in FIG. 7. As in the figure, the laser diode assembly of this kind has a cap unit hermetically sealing a laser diode for protecting against the external ambient, moisture, etc. The laser diode assembly has a metal stem 21 having a heat sink 21a formed by, for example, cold forging integrally with the stem 21, and two through-holes 21b formed through the stem 21 as shown in FIG. 8. A laser diode 23 is mounted on the upper end of the heat sink 21a via a sub-mount 22. A common electrode 28 is welded to the underside of the stem 21 to provide electrical connection to the stem 21 and the heat-sink 21a. On the other hand, lead electrodes 26, are held by the stem 21 via an insulating material such as a low melting glass 29 in a manner of being insulated therefrom. The laser diode 23 has one electrode electrically connected via conductor wires, not shown, to the lead electrodes 26, and the other electrode formed in an underside thereof being electrically connected via the sub-mount 22 and the stem 21 to the common electrode 28. The laser diode 23 is hermetically sealed in a space defined by the stem 21 and the cap 24. To provide hermetical seal, the cap 24 is conventionally welded onto the surface of the stem 21.

The cap 24, on the other hand, has a window formed with a window glass 25 at a top wall thereof, for transmission of light emitted by the semiconductor laser diode 23. The window glass 25 is adhered to an inner surface of the cap 24 through a low melting glass as an adhesive, not shown, in an airtight manner. The cap 24 is attached onto the stem 21 by means of electric welding. In order to enhance weldability, a projection 24b is formed in a bottom end of the flange 24a, i.e., the bottom of the cap 24 to provide linear contact with the surface of the stem 21, as shown in FIG. 8. The contact between the stem 21 and the cap 24 via the projection 24b causes concentration of electric current passed therethrough, with placing in the electrodes 31, 32 ensuring a connection between the stem 21 and the cap 24.

For semiconductor laser diode assemblies as stated above, the stem 21 is usually formed integrally with the heat sink 21a through cold forging from a thick sheet material, requiring a large scale of a fabricating system. There is therefore a problem of incurring mounting-up of fabrication cost, and accordingly inexpensive supply of such laser diode assemblies is difficult.

Furthermore, there is a disadvantage that there are inevitably encountered variations in contact between the welding projection 24b and the surface of the stem 21, resulting in variations in concentration of electric current passed therethrough and hence nonuniformity of welding. Accordingly, it is difficult to provide uniformity of welding and hence sealability for semiconductor laser diodes.

To cope with this, it may be considered that the cap be press-fitted onto the stem to offer hermetic seal between the cap and the stem. However, such method has not yet been practiced, because if so done there is high possibility of incurring cracks or breaks in the window glass or the low melting adhesive glass, when a pressing force is applied onto the top face of the cap.

For carrying out welding between the cap and the stem, a flange must be formed in the lower end of the cap, and an allowance margin has to be given to the stem to cope with deviation in diametrical position of the cap relative to the stem. However, such structure hinders compactness for semiconductor laser diode assemblies, particularly in diametric sizes.

In particular, there is a recent demand of reducing the overall or diametrical size for semiconductor laser diode assemblies, e.g., 3 mm or smaller in applications such as for CD players, LD players, or CD-ROM players. However, in the conventional structure, there is a necessity of providing an allowance margin of at least 0.5 mm to a stem and a flange in a cap of not smaller than 0.4 mm. To this end, there is a limitation for reducing the diametrical size of the package, to approximately 5.6 mm or smaller, thus making difficult to miniaturize semiconductor laser diode assemblies to a desired size.

Meanwhile, where a semiconductor laser diode assembly is employed in an optical pickup device including a diffraction grating, a laser diode assembly is entirely built into a holder 33, as shown in FIG. 9, by fixing the stem 21 onto the bottom of the holder 33. In such cases, a diffraction grating 32 is attached to an aperture formed in the holder 33 by being pressed against the inner surface of the holder 33 by the force of the spring 31. The spring 31 is held at the opposite end by a top face of the cap 24. However, the force of the spring 31 is usually set to approximately 3 to 5 kg for securing the difraction grating 32, which force is liable to cause cracks or breaks in a window glass or an adhesive glass fixing to the cap 24, hindering the sealability of the laser diode assembly.

SUMMARY OF THE INVENTION

It is therefore an object of the present invention to provide a semiconductor laser diode assembly of a can-seal type, which is compact in size and easy to manufacture, providing a source of laser beam adapted for CD players, CD-ROM players and so on.

It is another object of the present invention to eliminate an allowance margin of the stem unit for welding with the cap unit, making the laser diode assembly compact.

It is a further object of the present invention to prevent occurrence of cracks or breaks in a window glass or an adhesive glass for attaching thereof when the cap unit is fixed on the stem unit.

It is yet a further object of the present invention to provide a method of manufacturing a semiconductor laser diode assembly which is compact in size and easy to manufacture.

In accordance with a first aspect of the present invention, there is provided a semiconductor laser diode assembly comprising: a semiconductor laser diode for emitting a beam of light; a ring member having a heat sink formed integral therewith, the semiconductor laser diode being mounted on the heat sink through a sub-mount; a common electrode formed electrically connected with the ring member; a lead electrode held by the ring member through an insulating material filled therebetween in an airtight manner; a stem unit formed by the ring member, the lead electrode, and the insulating material to provide electricity the semiconductor laser diode; and a cap unit fixed on the stem unit for hermetically sealing the semiconductor laser diode, the cap unit has a window through which a beam of light emitted by the semiconductor laser diode is radiated. With such structure, the stem can be constituted by a ring member and lead electrodes secured to the inside of ring member via an insulating material such as a low melting glass, wherein the ring member is easily formed by press working such as drawing or blanking from a metal sheet. It is therefore possible to reduce the size of the stem small without necessitating complicated working such as forging with a thick plate.

Preferably, the ring member has a flange formed at a lower end thereof to provide constancy in height of the semiconductor laser diode with respect to an upper surface of the flange, the flange having cut-outs for positioning the ring member in place in a circumferential direction thereof. With such arrangement, where a semiconductor laser diode assembly is built into a device such as a CD player, the flange of a stem can be utilized as a reference plane such that a beam of light is constantly and properly positioned by a simplified manner.

More preferably, the cap unit comprises a metal shell formed with the window therein, the metal shell has an inner peripheral surface thereof fitted over an outer peripheral surface of the ring member to provide hermetic seal for the semiconductor laser diode. By doing so, it is possible to omit a flange for welding from a cap unit, together with an allowance margin for welding from a stem unit. This also contributes to reduction of diametrical size of the laser diode assembly.

In accordance with a second aspect of the present invention, there is also provided a semiconductor laser diode assembly comprising: a cap unit fixed on the stem unit for hermetically sealing the semiconductor laser diode, the cap unit has a window through which a beam of light emitted by the semiconductor laser diode is radiated; and a reinforcing projection annularly formed on a top face of the cap unit. With such arrangement, there is almost no fear that cracks or breaks occur in a window glass, i.e., the light-transmissible glass, when a pressing force is applied onto the cap unit from the above, for example, during press-fitting the cap unit onto the stem unit.

In accordance with a third aspect of the present invention, there is further provided a cap unit for electronic component assembly comprising: a metal shell cylindrically formed to have a top wall therein, the metal shell having an aperture in the top wall; a light-transmissible member adhered to an inside of the metal shell to cover the aperture for providing a window through which light is allowed to pass; and a reinforcing projection annularly formed on a top face of the metal shell. The cap unit may be utilized for other assemblies involving a device such as a phototransistor, a photodiode, and a light-emitting diode of metal cap types, besides semiconductor laser diode assemblies.

In accordance with a fourth aspect of the present invention, there is provided a method of manufacturing a semiconductor laser diode assembly comprising the steps of: (a) preparing a stem unit, (a-1) forming a ring member having a heat sink and a common electrode, together with forming lead electrodes, (a-2) mounting a semiconductor laser diode on the heat sink through a sub-mount, (a-3) provide electrical connection between the semiconductor laser diode and a lead electrode, thereby preparing a stem unit; (b) preparing a cap unit, (b-1) forming a metal shell having an aperture in a top wall thereof, (b-2) attaching a light-transmissible member in an inner surface of the metal shell to cover the aperture for providing a window through which a beam of light emitted by the semiconductor laser diode is allowed to radiate, thereby preparing a cap unit; and (c) fitting an inner peripheral surface of the metal shell over an outer peripheral surface of the ring member so that the cap unit is fixed on the stem unit in a manner providing hermetic seal for the semiconductor laser diode. In such method, the cap unit is appropriately press-fitted onto the stem unit in a self-aligned manner. This eliminate the necessity of an allowance margin as required in the conventional welding, providing compactness for the laser diode assembly.

The laser diode assembly can be easily and inexpensively manufactured by forming a metal sheet by press drawing and blanking into the ring member in a manner such that the heat sink and the common electrode are integrally formed therewith, and then filling an insulating material in the ring member to airtightly hold the lead electrode and insulate the lead electrode therefrom.

A better understanding of the features and advantages of the present invention will be obtained by reference to the following detailed description and accompanying drawings which set forth illustrative embodiments to which the principles of the invention are applied.

BRIEF DESCRIPTION OF THE DRAWINGS

FIG. 1(a) is a sectional view of a semiconductor laser diode assembly according to a first embodiment of the present invention, while FIG. 1(b) is an enlarged view showing a laser diode and its surrounding portion;

DETAILED DESCRIPTION

Figure 1:
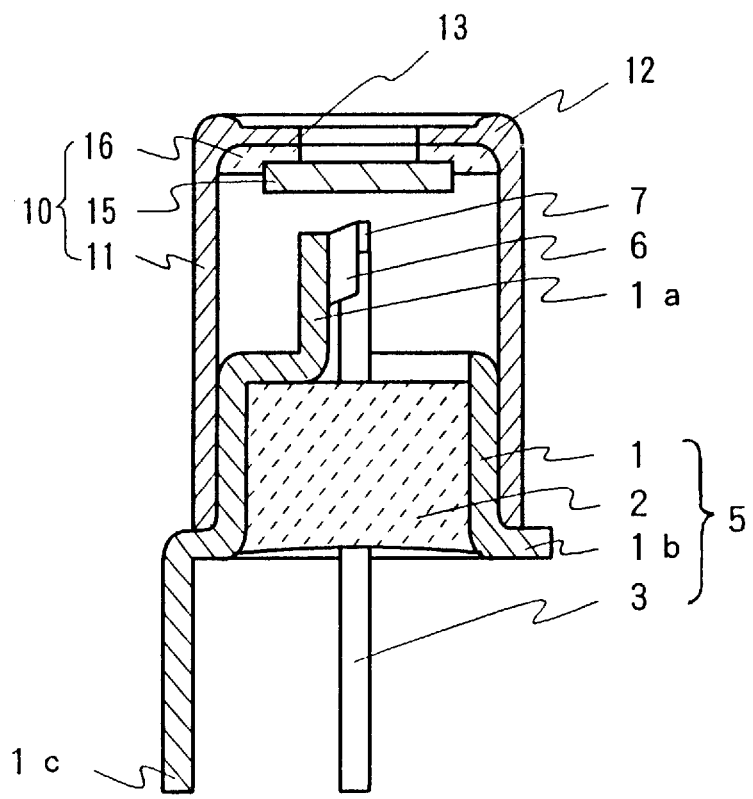
Figure 1:
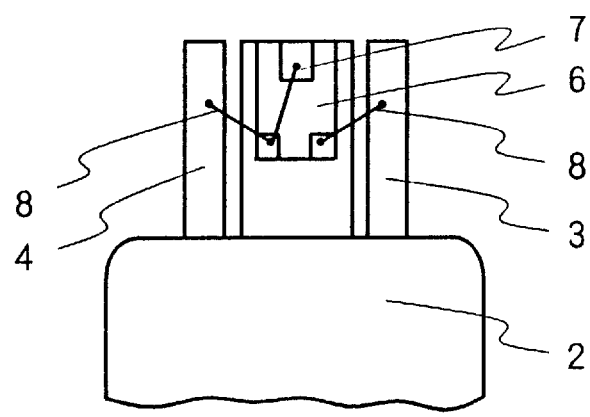

Referring to FIGS. 1(a) to 1(b), there is illustrated a first embodiment of a semiconductor laser diode assembly according to one embodiment of the present invention. The semiconductor laser diode assembly comprises a stem unit 5 generally in a cylindrical form, and a cap unit 10 in a reverse-bottomed tubular form which is fixed on the stem unit 5.

The stem unit 5 comprises a ring member 1 which is formed of an Fe-based conductor metal. The ring member 1 is generally in a tubular form, which has a flange 1b extending outward from a lower end thereof, a heat sink 1a extending centrally and upwardly from an upper end thereof, and a common electrode 1c extending downward from an outer end of the flange 1b. The ring member 1 defines therein an inner space in which an insulating material, e.g., a low melting glass 2 is filled. Two lead electrodes 3, 4 are held airtightly by the insulating material 2 in the ring member 1 so that these lead electrodes 3, 4 respectively extend close to the heat sink 1a. It is noted that the ring member 1 can be formed from an Fe-based metal sheet having a thickness of ranging from 0.2 to 0.4 mm. Alternatively, the ring member 1 may be formed from a Cu-based metal sheet instead of the Fe-based sheet.

A semiconductor laser diode 7 as a light source is mounted on a tip portion of the heat sink 1a via a silicon sub-mount 6. The laser diode is so small, e.g., 200 $\mu$m by 150 $\mu$m, that it is previously bonded on the sub-mount 6 for facilitating assembling processes. The sub-mount 6 mounted with the laser diode 7 is mounted on the tip portion of the heat sink 1a. In the present example, a photodiode for receiving light, not shown, is formed in the sub-mount as a silicon substrate so that the intensity of a laser beam emitted by the laser diode 7 is monitored by the photodiode. The laser diode 7 and the photodiode have respective one electrodes provided in the backside thereof electrically connected via the sub-mount to the common electrode 1c where electrical connection is to be externally made. On the other hand, the laser diode 7, together with the sub-mount 6, has the other electrode electrically connected via an Au wire 8 to the lead electrode 4, as shown in FIG. 1(b). Meanwhile, the photodiode has the other electrode connected via an Au wire 8 to the lead electrode 3.

Figure 2:
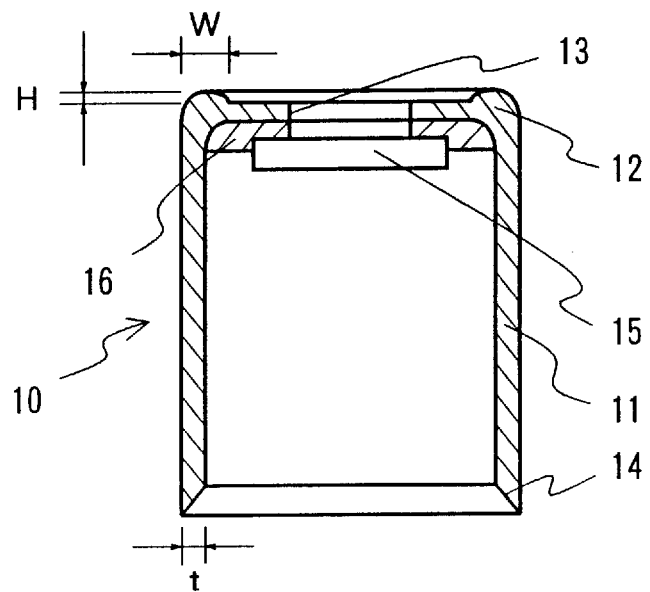
FIG. 2 is a sectional view of a cap unit of the semiconductor laser diode assembly of FIG. 1.

Referring to FIG. 2, the cap unit 10 comprises a shell member 11 which is generally in a reverse-bottomed tubular form. The shell member 11 is formed, e.g., from a Kovar sheet through press working such as drawing and blanking. The shell member 11 has an aperture 13 formed in a top wall thereof and a lower opening 14. The aperture 13 is covered by a window glass (a light-transmissible member) 15. The window glass 15 is fixed to an inner surface encompassing the aperture 13. The fixation of the window glass 15 is done by the use of a low melting glass 16 as an adhesive, so that the window glass 15 is adhered to the shell member 11 airtightly.

The cap unit 10 constructed as above is fixed on a stem unit 5 mounting with the laser diode 7 such that a laser beam emitted from the laser diode 7 is allowed to radiate through the window glass 15 toward the outside of the laser diode assembly.

The cap unit 10 of the present invention has a reinforcing projection 12 annularly formed on an outer top surface of the shell member 11 so that it upwardly projects from the edge between the tubular side wall and the top wall of the shell member 11. This structure is based on the finding from the results of simulative tests conducted by the present inventors. That is, it has been found that, where a cap unit 10 provided with a reinforcing projection 12 is press-fitted to a stem unit 5, the cap unit 10 is relieved of stresses to such an extent that no cracks or breaks occur in a window glass 15 or a low temperature glass 16. This is because where stresses are induced by a downwardly pressing force applied onto the top wall of the cap unit 10, the stresses concentrate in the reinforcing projection 12 of the shell member 11. This in turn results in relief of stresses in the vicinity of the window glass 15 and the adhesive glass 16, though tensile stresses are slightly caused in the window glass 15. In this manner, the window glass 15 and the adhesive glass 16 are relieved of stresses by providing the reinforcing projection 12 in the top face of the shell member 11.

The reinforcing projection 12 may be formed in a size of, e.g., a height H of 0.03 mm and the width W of 0.25 mm, where the cap unit 10 has an overall height of 3 mm and inner diameter of 2.2 mm with a wall thickness t of 0.15 mm. The reinforcing projection 12 may be formed to such a shape that the downwardly applied force on the cap unit 10 is received by the reinforcing projection 12 instead of the entire top surface of the cap unit 10. The width W of the reinforcing projection 12 is preferably determined to not greater than approximately twice the lateral wall thickness or the thickness t. This is because if the width is excessively broad, the force will act almost on the entire top surface, reducing the effect by the projecting portion.

Figure 3A:
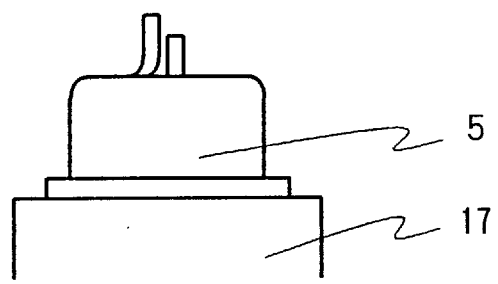
FIGS. 3(a) to 3(d) are sectional views for explaining the process of assembling a cap unit onto a stem unit.
Figure 3B:
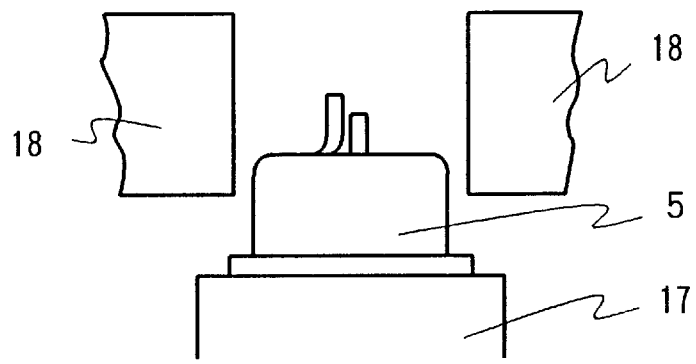
Figure 3:
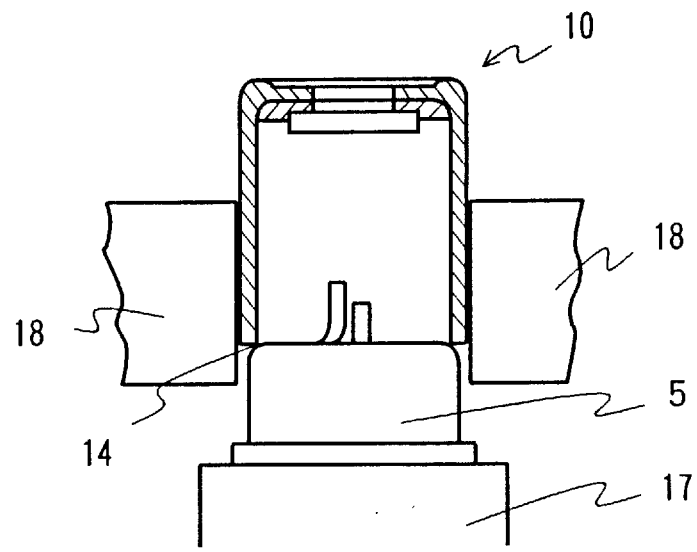
Figure 3:
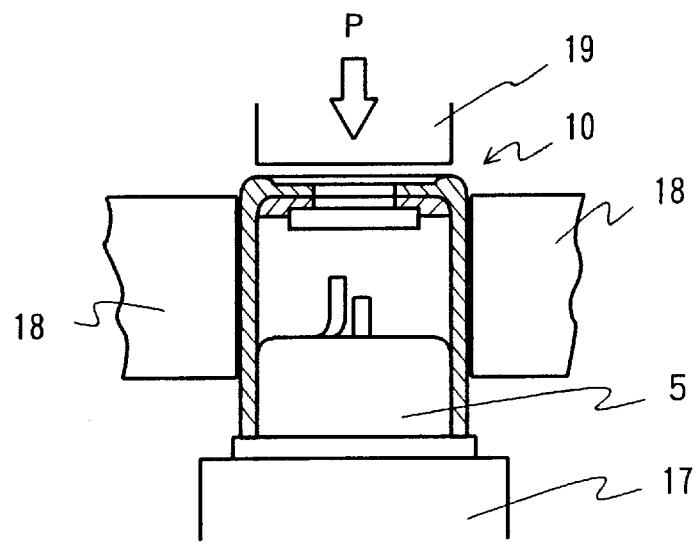

For press-fitting a cap unit over the stem unit, an assembling apparatus is employed. The assembling apparatus is provided with a positioning table 17 having a horizontal planar surface for placing thereon a stem unit 5, a cap guide 18 for guiding the cap unit 10, and pressing member 19 having a planer surface which is vertically movable for pressing the cap unit 10 downward. With the assembling apparatus, a stem unit 5 is first placed, e.g., by a vacuum collet in position on the positioning table 17, as shown in FIG. 3(a). Then, the cap guide 18 is lowered to a position over the stem unit 5 that its guide face is axially aligned with therewith, as shown in FIG. 3(b). Subsequently, a cap unit 10 is inserted into the cap guide 18 so that the cap unit 10 is rested at its lower opening on the shoulder of the stem unit 5, as shown in FIG. 3(c). In such a state, the pressing member 19 is moved downward to depress the top wall, i.e., the reinforcing projection 12 of the cap unit 10, so that the cap unit 10 is press-fitted in a self-aligned manner onto the outer peripheral surface of the stem unit 5, as shown in FIG. 3(d). It is noted that the depth of fitting is controllable by determining the stroke of the pressing member 19. The outer diameter of the stem unit 5, i.e., the ring member 1, may be approximately 2.21 mm and the inner diameter of the lower opening 10 of the shell member 11, be approximately 2.20 mm. The pressing force of the pressing member 19 may be approximately 17 kg.

Then, the results of the simulative tests are explained. The simulative tests were conducted to investigate on the distribution of stresses induced by press-fitting of a cap unit onto a stem unit. The results of the test for the inventive structure and the conventional art as a comparative example are shown in respective partial sectional views of FIG. 4 and FIG. 5. Incidentally, the test was made under conditions that the lower opening 14 of the cap unit 10 is completely held so as to avoid spreading of it outward. Each figure illustrates part of a shell member 11, a window glass 15, and an adhesive glass 16. In the figures, the areas denoted by reference character A shows strong tensile stresses of 40 to 2.5 kg·f/mm², the areas by character B weak tensile stresses of 2.5 to 0.952 kg·f/mm², the areas by character C a transitional state of between tensile stresses and compressive stresses of 0.952 to –0.599 kg·f/mm², the areas by character D weak compressive stresses of –0.599 to –1.37 kg·f/mm², and the areas by character E strong compressive stresses of –1.37 to –40 kg·f/mm².

Figure 4:
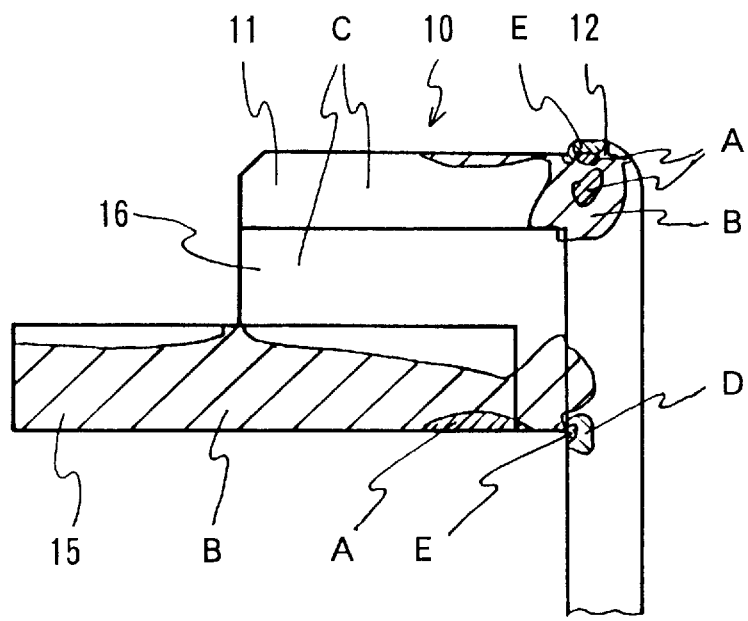
FIG. 4 is a partially enlarged sectional view of a cap unit of FIG. 1, which shows stress distributions presented by simulative testing.
Figure 5:
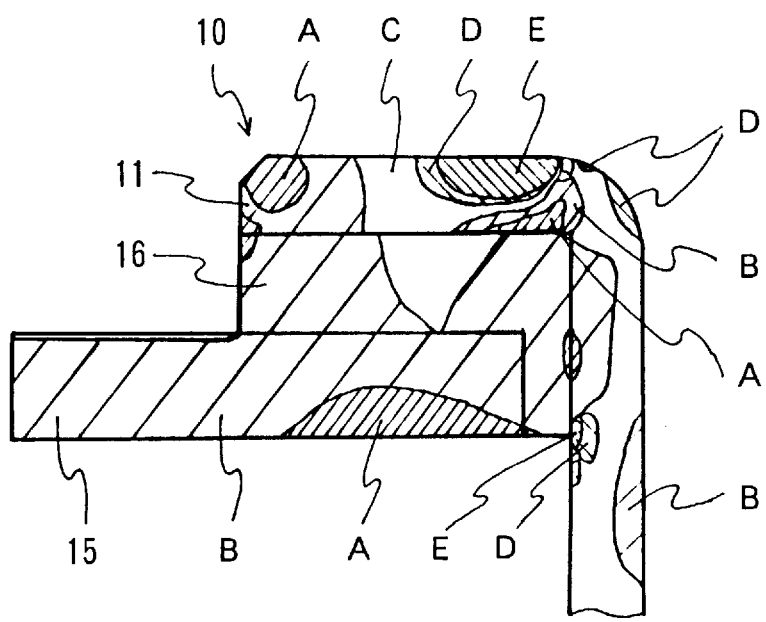
FIG. 5 is a partially enlarged sectional view of a cap unit of a comparative example, which shows stress distributions presented by the simulative testing.

As is understood from FIG. 4, with the cap unit 10 formed with the reinforcing projection 12 according to the present invention, there are distributed strong stresses A which are observed limited only to an extremely narrow area of a lower end portion of the window glass 15. In particular, the window glass 15 has a weak tensile-stress area B in a lower portion with almost no stresses C applied to an upper portion near and involving the adhesive glass 16. On the contrary, in the conventional art without an reinforcing projection as shown in FIG. 5, the window glass 15 has a strong stress area A broadly present therein. Both the window glass 15 and the adhesive glass 16 have a weak stress area B almost entire area thereof. Further, a strong compressive-stress area E is present in an upper portion of the shell member 11, which stresses act to strongly attract the window glass 15. It is therefore understood that in the conventional art there is higher possibility that the cracks or breaks are apt to occur in the window glass 15.

Further, tests were conducted as to airtightness for semiconductor laser diode assemblies according to the present invention and the comparative conventional art. In the tests, criterion of an airtightness of 5.1 Pa·cc/sec was used as to whether leakage of air takes place or not. That is, where there is no leakage of air, the assembly is determined as acceptable. The inventive semiconductor laser diode assemblies in number of 40 were subjected to testing, and none of them were unacceptable. On the other hand, the conventional assemblies in number of 40 were tested, and there involved two of unacceptable assemblies.

In the present invention, the stem unit 5 is formed by the cylindrical ring 1 from a leadframe so that the lead electrodes 3, 4 are fixed through the insulator material 2 in the ring member 1, making it possible to reduce the outer diameter of the semiconductor laser diode assembly to, e.g., 3 mm or smaller. Further, there is no necessity of implementing complicated processes such as forging, thereby reducing fabrication cost.

In this manner, hermetic seal is provided by press-fitting the inner surface of the cap unit 10 onto the outer peripheral surface of the stem unit 5 in an self-aligned manner. Accordingly, there is no necessity of providing the stem unit with a welding margin without giving a welding projection in a cap unit, thus simplifying the structure as well as the process. In particular, the flange of the stem unit according to the present invention can be reduced to as small as approximately 0.25 mm, despite the flange of the conventional art requires, e.g., 1 mm or greater. To this end, the semiconductor laser diode assembly of the present invention is reduced of its diametrical size by approximately 1.5 mm. Incidentally, in order to provide hermetic seal more complete, it is desired that the outer peripheral surface of the stem unit and/or the inner surface of the cap unit is electroplated with, e.g., SnPb, In, or Ag.

The employment of the cap unit 10 formed with the projecting portion eliminates occurrence of cracks or breakage in the window portion to thereby improve the reliability, even where a diffraction grating is held by a spring in the conventional welded structure.

The cap unit 10 may likewise be applied to light-emitting or light-receiving assemblies involving a window with hermetic seal, such as for phototransistors, photodiodes, and light emitting diodes of the metal-cap type, besides semiconductor laser diodes.

Figure 6:
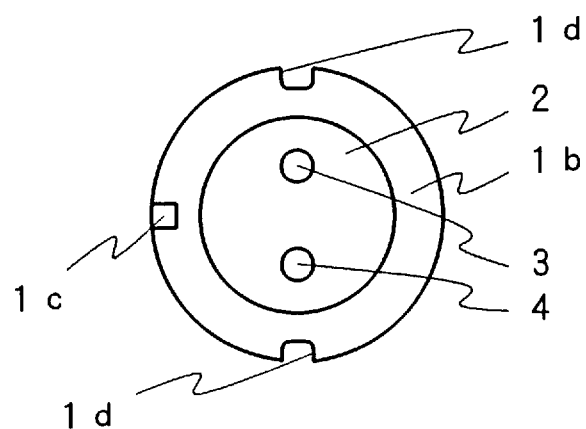
FIG. 6 is a bottom plan view of a stem unit of a semiconductor laser diode assembly according to a second embodiment of the present invention.
Figure 7:
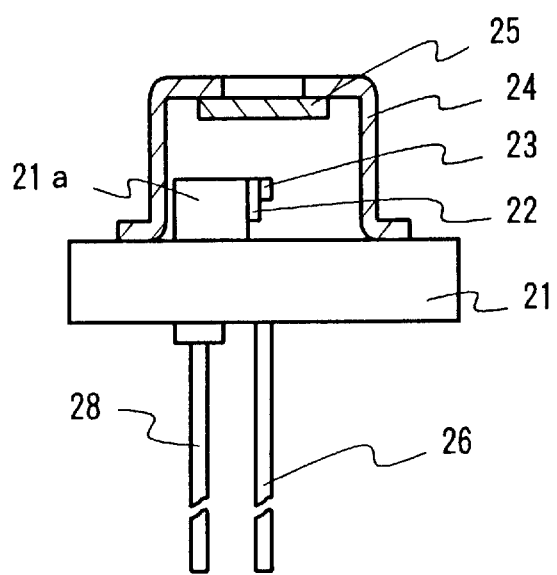
FIG. 7 is a sectional view of a conventional semiconductor laser diode assembly.
Figure 8:
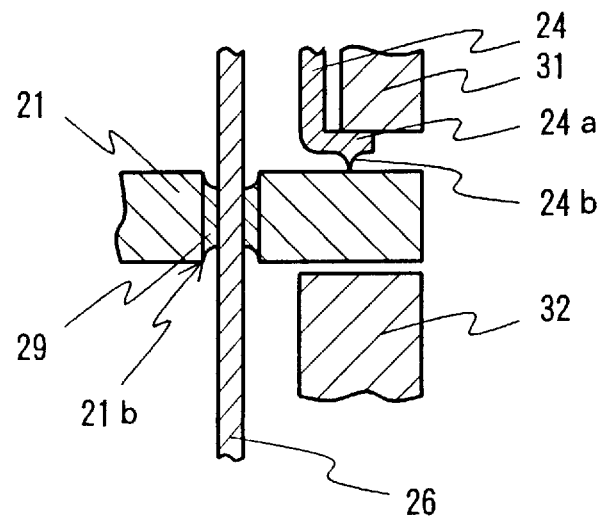
FIG. 8 is a partially enlarged sectional view showing a welding projection of the conventional semiconductor laser diode assembly before welding.
Figure 9:
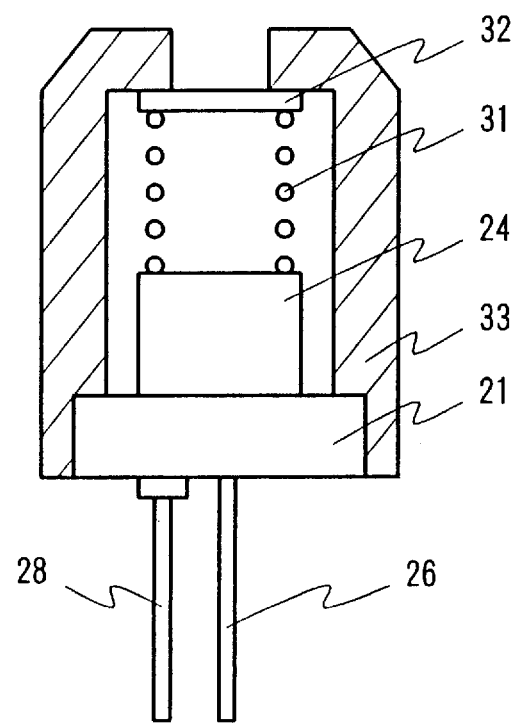
FIG. 9 is an explanatory view of a conventional semiconductor laser diode assembly in a state that a diffraction grating is attached thereto.

Then, a second embodiment of a semiconductor laser diode assembly is explained below. The second embodiment is different from the first embodiment in that a ring member 1 has cut-outs 1d formed therein as shown in FIG. 6. The ring member 1 is formed by press working such as drawing and blanking of an Fe-based metal sheet with a thickness of 0.2 to 0.4 mm, similarly to the first embodiment.

A plurality of cut-outs 1d are provided in the flange 1b of the ring member 1 so that the ring member 1 can be positioned in place relative to a circumferential direction thereof. The ring member 1 has an inner space thereof filled with an insulating material 2 such as a low melting glass so that lead electrodes 3, 4 are held by hermetically sealing the insulating material 2. Thus, a stem unit 5 is constituted by the ring member 1, the insulating material 2, and the lead electrodes 3, 4. Incidentally, the cutout portion 1d may be formed in other shapes, e.g., a shape straightly cut away arcuate portions, instead of the shape as shown in FIG. 6.

In assembling, the stem unit 5 is placed in position with reference to the cut-outs 1d, and then a sub-mount 6 previously bonded with a laser diode 7 is transported and mounted onto the heat sink 1 in place. On this occasion, the positioning of the sub-mount 6 is performed with reference to an upper surface of the flange 1b. By doing so, it is possible to build a laser diode assembly into a proper position of, e.g., a CD player assembly with utilizing the upper surface of the flange 1b as a reference surface. It is satisfactory that the flange 1b has a radial length of approximately 0.3 mm, because almost no deviation occur laterally in a cap unit relative to the stem unit, and hence no allowance is necessitated in the stem unit for avoiding such deviation.

The laser diode 7 thus fixed on the stem unit 5 is hermetically sealed by a pre-assembled cap unit as in the first embodiment. This hermetic sealing is performed by fitting an inner surface of the cap unit onto an outer peripheral surface of the ring member. Such sealing is possible by various ways such as providing an electroplating layers using a soft metal to respective fitting surfaces, applying an adhesive such as an epoxy resin between the facing surfaces, besides press-fitting of these surfaces.

As described above, the stem unit is constituted by a ring member made from a leadframe so that lead electrodes are secured to an inside of the ring member via an insulating material. No forge working is required for formation of the stem unit, thus simplifying the manufacturing process. The structure of the invention makes possible reduction in diametric size of the laser diode assembly, as compared with the conventional assembly.

Furthermore, the reinforcing projection contributes to prevention against occurrence of cracks or breaks in the window glass or the adhesive glass of the cap unit, even where a pressing force is applied onto the top face of the cap member. Due to the presence of the reinforcing projection, it is possible to improve the airtightness for the laser diode by press-fitting the cap unit to the stem unit in a simplified manner, instead of unstable electric welding. It is to be understood that various changes, modifications, and adaptations of the above described embodiments may be practiced without departing from the spirit and scope of the invention as set forth in the appended claims.

What is claimed is:

1. A semiconductor laser diode assembly comprising:
    a semiconductor laser diode for emitting a beam of light;
    a cylindrically shaped ring member having a heat sink formed integral therewith, said semiconductor laser diode being mounted on said heat sink through a sub-mount;
    a common electrode formed integral with said ring member;
    a lead electrode held by said ring member through an insulating material filled therebetween in an airtight manner;
    a stem unit formed by said ring member, said lead electrode, and said insulating material so as to provide electricity to said semiconductor laser diode; and
    a cap unit fixed on said stem unit for hermetically sealing said semiconductor laser diode, said cap unit has a window through which a beam of light emitted by said semiconductor laser diode is radiated.

2. The semiconductor laser diode assembly of claim 1, wherein said sub-mount is formed of silicon for providing electrical connection between said semiconductor laser diode and said common electrode.

3. The semiconductor laser diode assembly of claim 2, wherein a photodiode is formed in said sub-mount to monitor the intensity of a beam of light emitted by said semiconductor laser diode.

4. The semiconductor laser diode assembly of claim 1, wherein said ring member has a flange formed at a lower end thereof to provide constancy in height of said semiconductor laser diode with respect to an upper surface of said flange, said flange having cut-outs for positioning said ring member in place in a circumferential direction thereof.

5. The semiconductor laser diode assembly of claim 1, wherein said cap unit comprises a metal shell formed with said window therein, said metal shell has an inner peripheral surface thereof fitted over an outer peripheral surface of said ring member to provide hermetic seal for said semiconductor laser diode.

6. The semiconductor laser diode assembly of claim 1, wherein said cap unit has a reinforcing projection formed annularly and integral therewith on a top face of said cap unit.

7. A semiconductor laser diode assembly comprising:

a semiconductor laser diode for emitting a beam of light;

a stem unit having a heat sink formed integral therewith for mounting thereon said semiconductor laser diode through a sub-mount;

a common electrode and a lead electrode formed in said stem unit to provide electrical connection to said semiconductor laser diode;

a cap unit fixed on said stem unit for hermetically sealing said semiconductor laser diode, said cap unit has a window through which a beam of light emitted by said semiconductor laser diode is radiated, wherein said cap unit including a) a light transparent member adhered to an inner surface of said cap unit to cover said window and b) a reinforcing projection annularly formed on a top outer surface of said cap unit to project above said light transparent member.

* * * * *